United States Patent [19]
Onoda

[11] Patent Number: 6,038,432
[45] Date of Patent: Mar. 14, 2000

[54] AUTOMATIC TRANSMISSION POWER CONTROL CIRCUIT

[75] Inventor: Masahiro Onoda, Kawasaki, Japan

[73] Assignee: Fujitsu Limited, Kanagawa, Japan

[21] Appl. No.: 09/054,805

[22] Filed: Apr. 3, 1998

[30] Foreign Application Priority Data

Oct. 7, 1997 [JP] Japan .................................. 9-274794

[51] Int. Cl.[7] .............................. H01Q 11/12; H03G 3/20
[52] U.S. Cl. ......................... 455/127; 455/126; 455/117; 455/423; 330/129
[58] Field of Search ................................ 455/126, 127, 455/117, 250.1, 115, 67.1, 423; 330/129

[56] References Cited

U.S. PATENT DOCUMENTS

| | | | |
|---|---|---|---|
| 3,621,410 | 11/1971 | Badger et al. | 330/2 |
| 3,969,683 | 7/1976 | Fabricius | 330/129 |
| 4,634,997 | 1/1987 | Tompsett et al. | 330/284 |
| 4,691,172 | 9/1987 | Fukahori et al. | 330/129 |
| 4,803,440 | 2/1989 | Hotta et al. | 330/145 |
| 5,507,016 | 4/1996 | Okuhara | 455/126 |
| 5,566,363 | 10/1996 | Senda | 455/126 |
| 5,752,171 | 5/1998 | Akiya | 455/126 |

FOREIGN PATENT DOCUMENTS

55-83311  6/1980  Japan .
61-109497  5/1986  Japan .

*Primary Examiner*—Reinhard J. Eisenzopf
*Assistant Examiner*—Charles N. Appiah
*Attorney, Agent, or Firm*—Helfgott & Karas, P.C.

[57] ABSTRACT

An automatic transmission power control circuit which can detect an abnormality in a transmission power without a comparing circuit which compares a detected voltage with reference voltages. A detector detects a voltage corresponding to the transmission power and outputs a detected voltage. A comparator compares the detected voltage with a reference voltage so that the transmission power is controlled based on an output of the comparator. A transmission power abnormality detecting circuit includes a counter which cumulates the output of the comparator. The transmission power abnormality detecting circuit outputs a transmission power abnormality detection signal when an output of the counter is a value which is out of a normal range when the automatic power transmission control circuit is normally functioning.

10 Claims, 9 Drawing Sheets

AUTOMATIC TRANSMISSION POWER CONTROL CIRCUIT

BACKGROUND OF THE INVENTION

1. Field of the Invention

The present invention relates to an automatic transmission power control circuit provided with a function to detect an abnormality of a transmission power and, more particularly, to an automatic transmission power control circuit for a transmitter which requires a monitor of the transmission power in a base station of a mobile radio communication system.

2. Description of the Related Art

An allowable fluctuation of an output power of a base station in a mobile communication system is specified, for example, as a range from +20 to −50% with respect to a reference transmission power. In this case, an automatic transmission power control circuit is provided in the base station in order to absorb fluctuation in the transmission power due to allowable tolerances of circuitry and a change in circumstances. Additionally, an alarm signal may be generated when an abnormality occurs in a transmission power, that is, when the transmission power is out of an allowable range.

Figure 1:
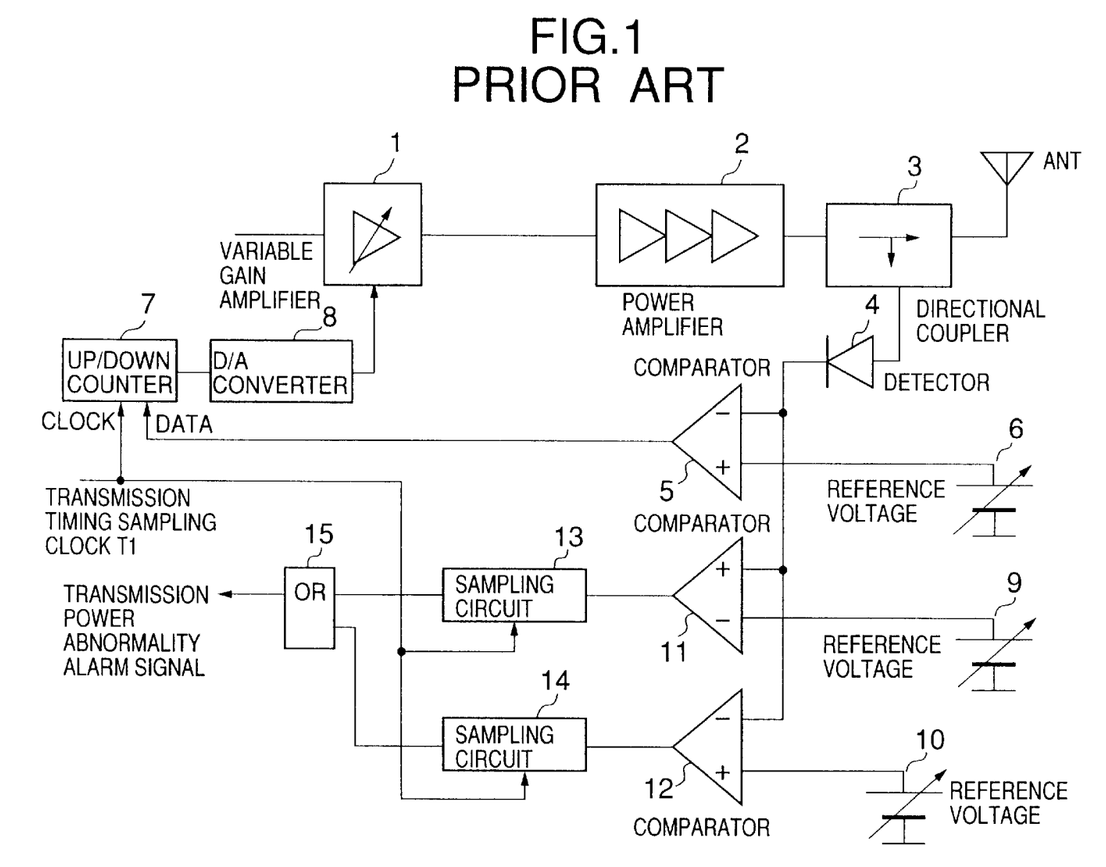
FIG. 1 is a circuit diagram of a conventional automatic transmission power control circuit.

FIG. 1 is a circuit diagram of a conventional automatic transmission power control circuit. Hereinafter the automatic transmission power control circuit may be referred to as APC.

In the APC shown in FIG. 1, a modulated wave to be transmitted is transmitted from an antenna ANT via a variable gain amplifier 1, a power amplifier 2 and a directional coupler 3. A part of the transmission power is branched by the directional coupler 3, and is detected by a detector 4. An output of the detector 4 is compared with a reference voltage 6 by a comparator 5. When the output of the detector 4 is less than the reference voltage 6, a high-level signal "H" is output from the comparator 5. On the other hand, when the output of the detector 4 is greater than the reference voltage 6, a low-level signal "L" is output from the comparator 5. The output of the comparator 5 is input to an up-down counter 7. When the output of the comparator 5 is the high-level signal "H", the up-down counter 7 counts up a count value by the output of the comparator 5 when a transmission timing sampling clock T1 is input. When the output of the comparator 5 is the low-level signal "L", the up-down counter 7 counts down the count value by the output of the comparator 5 when the transmission timing sampling clock T1 is input. An output of the up-down counter 7 is converted into an analog signal by a D/A converter 8. The analog signal controls the variable gain amplifier 1. It should be noted that a loop formed by the variable gain amplifier 1, the power amplifier 2, the directional coupler 3, the detector 4, the comparator 5, the up-down counter 7 and the D/A converter 8 is referred to as an automatic transmission power control loop.

When the APC functions normally, a magnitude of amplification of the variable gain amplifier 1 is increased when a level of the voltage (hereinafter referred to as a detected voltage) output from the detector 4 is small. On the other hand, the magnitude of amplification of the variable gain amplifier 1 is decreased when the detected voltage is large. Accordingly, the transmission power of the antenna ANT can be set to a level specified by the reference voltage 6. In this case, a relationship between the reference voltage 6 ($V_{REF}$) and the detected voltage is indicated in the left half of a graph of FIG. 2. That is, the voltage output from the detector 4 does not fluctuate too much, and is substantially equal to the reference voltage 6.

Figure 2:
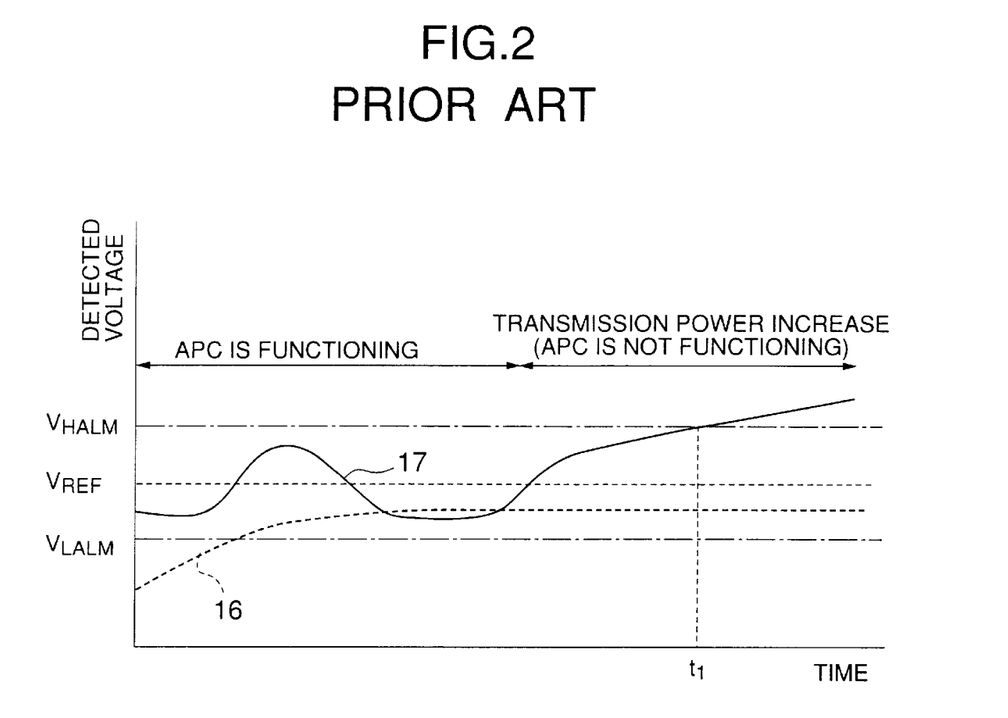
FIG. 2 is a graph showing a relationship between a detected voltage and a function of the conventional automatic transmission power control circuit.

If the APC cannot control the transmission power while the transmission power is increasing, the detected voltage is continuously increased from the reference voltage 6 as indicated in the right half of the graph of FIG. 2. In such a case, the comparator 5 continuously outputs the low-level signal. On the other hand, if the APC cannot control the transmission power while the transmission power is decreasing, the detected voltage is continuously decreased from the reference voltage 6. In such a case, the comparator 5 continuously outputs the high-level signal.

A description will now be given of a generation of a transmission power abnormality alarm signal. A reference voltage 9 ($V_{HALM}$) is provided for an upper limit of the transmission power, and a reference voltage 10 ($V_{LALM}$) is provided for a lower limit of the transmission power. The reference voltage 9 is provided to a comparator 11, and the reference voltage 10 is provided to a comparator 12. The comparators 11 outputs a high-level signal "H" when the transmission power exceeds the upper limit, and the comparator 12 outputs a high-level signal "H" when the transmission power decreases below the lower limit. The outputs of the comparators 11 and 12 are sampled by respective sampling circuits 13 and 14 by the transmission timing sampling clock T1. The sampled outputs are supplied to an OR circuit 15. Accordingly, when an output of the OR circuit 15 is at the high level "H", this means that the transmission power exceeds the upper limit or decreases below the lower limit. This condition corresponds to an abnormal condition of the APC, and thus the output of the OR circuit is rendered to be a transmission power abnormality alarm signal. In the right half of the graph of FIG. 2, although the APC is not functioning, a circuit for detecting an abnormality of the transmission power is functioning. Thus, the output of the comparator 11 is the high-level signal "H" after a time t1 when the detected voltage exceeds the reference voltage 9 ($V_{HALM}$). The output of the comparator 11 is sequentially output as the transmission power abnormality alarm signal via the sampling circuit 13 and the OR circuit 15.

When the transmission power is smaller than a desired power, the high-level signal "H" is output from the comparator 5 so as to increase the output of the up-down counter 7. Thereby, the output of the D/A converter 8 increases a magnitude of amplification of the variable gain amplifier 1 in response to the output level of the up-down counter 7. Under a normal condition, the transmission power from the antenna ANT can be controlled to a desired power level by increasing the magnitude of amplification of the variable gain amplifier 1. However, when a malfunction occurs in a transmission circuit of the power amplifier 2, the transmission power may not be increased to the desired power level even when the magnitude of amplification of the variable gain amplifier 1 is continuously increased by increasing the output of the up-down counter 7. In such a case, the comparator 5 continuously outputs the high-level signal "H". Thereby, the variable gain amplifier 1 is controlled in a range (saturated range) beyond an operatable range. As a result, a distortion may occur in the transmission wave output from the antenna ANT, an adjacent channel leakage power may be increased, or a modulation accuracy may be deteriorated. However, even in such an abnormal condition, the abnormality cannot be recognized since the detected voltage output from the detector 4 is between the reference voltage 9 ($V_{HALM}$) and the reference voltage 10 ($V_{LALM}$) as indicated by a dashed line 16 in FIG. 2.

As mentioned above, in the conventional technique, there is a problem in that an abnormality cannot be recognized even when the transmission power does not reach a desired value and is distorted due to a malfunction of a part of the transmission circuit since the abnormality is detected based on only a level of the transmission power. That is, the abnormality cannot be recognized as long as the voltage detected by the detector 4 is within the range between the upper limit and the lower limit.

Additionally, the conventional APC requires the comparing circuit to detect an abnormality in the transmission power. Particularly, when an attempt is taken to detect both an abnormal increase and an abnormal decrease in the transmission power, the two comparators 11 and 12 are required. Additionally, the reference voltages 9 and 10 must be adjusted to appropriate values.

Further, in the conventional technique, it takes a relatively long time until the transmission power is stabilized when a power is turned on. If the time is too long, it is possible that the transmission power abnormality detecting circuit is activated, resulting in generation of an alarm.

SUMMARY OF THE INVENTION

It is a general object of the present invention to provide an improved and useful automatic transmission power control circuit in which the above-mentioned problems are eliminated.

A more specific object of the present invention is to provide an automatic transmission power control circuit which can detect an abnormality in the transmission power when the automatic transmission power control circuit is not functioning normally.

Another object of the present invention is to provide an automatic transmission power control circuit in which a comparing circuit which compares a detected voltage with reference voltages is not needed, which eliminates the comparing circuit and adjustment for the reference voltages.

A further object of the present invention is to reduce a time needed for stabilization when a power is turned on so as to prevent an erroneous transmission power abnormality signal from being generated.

In order to achieve the above-mentioned objects, there is provided according to one aspect of the present invention an automatic transmission power control circuit which automatically controls a transmission power of a radio communication system, the automatic transmission power control circuit comprising:

a detector which detects a voltage corresponding to the transmission power and outputs a detected voltage;

a comparator which compares the detected voltage with a reference voltage so that the transmission power is controlled based on an output of the comparator; and a transmission power abnormality detecting circuit including a counter which cumulates the output of the comparator, the transmission power abnormality detecting circuit outputting a transmission power abnormality detection signal when an output of the counter is a value which is out of a normal range when the automatic power transmission control circuit is functioning normally.

According to the above-mentioned invention, the transmission power of the automatic transmission power control circuit is monitored based on the output of the counter which is a cumulative value of the comparator. Since an abnormality occurring in the automatic transmission power control circuit is reflected to the cumulative value output from the counter, it can be determined that the automatic transmission power control circuit is not functioning normally when the cumulative value output from the counter is out of the normal range. Thus, the automatic transmission power control circuit according to the present invention does not need a comparator circuit for detecting an abnormality in the transmission power and a means for adjusting the comparator circuit. Additionally, the automatic transmission power control circuit according to the present invention can positively detect an abnormality in the transmission power even when the transmission power does not reach a target value but is within an allowable range due to a malfunction or deterioration of a part of a transmission circuit.

In the automatic transmission power control circuit according to the present invention, the counter may be reset when the output of the comparator is inverted so that the transmission power abnormality detection signal is output from the transmission power abnormality detecting circuit when the output of the counter exceeds a predetermined value.

Additionally, the counter may be an up-down counter, and the transmission power abnormality detection signal output from the transmission power abnormality detecting circuit may comprise a ripple carry which is output from the up-down counter. Accordingly, the function of the up-down counter is effectively used, and a structure of the automatic transmission power control circuit can be simplified.

Additionally, in the automatic transmission power control circuit according to the present invention, the transmission power abnormality detecting circuit may obtain a difference between a current value of the output of the counter and a previous value of the output of the counter, the previous value being output a predetermined time prior to the current value, so as to output the transmission power abnormality detection signal when an absolute value of the difference exceeds a predetermined value.

Alternatively, the transmission power abnormality detecting circuit may output the transmission power abnormality detection signal when an absolute value of the output of the counter exceeds a predetermined value.

Additionally, the automatic transmission power control circuit according to the present invention may further comprise a second counter included in a control loop circuit outputting the controlled transmission power so as to cumulate the output of the comparator, wherein a first clock signal is provided to the second counter when a power is turned on and a second clock signal is provided to the second counter instead of the first clock signal after the transmission power is substantially raised to a level to be controlled, the first clock signal having a frequency higher than the second clock signal.

Accordingly, the counter used in the control loop circuit is provided with the first clock signal having a frequency higher than that of the second clock signal, the second clock signal being provided after a predetermined time has passed after the power is turned on. Thus, a loop gain of the automatic transmission power control circuit can be rapidly raised to a desired level, resulting in a reduction in a time for stabilizing the transmission power.

Additionally, there is provided according to another aspect of the present invention an automatic transmission power control circuit which automatically controls a transmission power of a radio communication system, the automatic transmission power control circuit comprising:

a detector which detects a voltage corresponding to the transmission power and outputs a detected voltage;

a comparator which compares the detected voltage with a reference voltage so that the transmission power is controlled based on an output of the comparator;

an up-down counter which cumulates the output of the comparator; and a transmission power abnormality detecting circuit which obtains a difference between a current value of an output of the up-down counter and a previous value of the output of the up-down counter, the previous value being obtained a predetermined time prior to the current value, so as to output a transmission power abnormality detection signal when an absolute value of the difference exceeds a predetermined value.

According to the above-mentioned invention, the up-down counter can be commonly used for the control loop circuit and the transmission power abnormality detecting circuit. This simplifies a structure of the automatic transmission power control circuit.

Additionally, there is provided according to another aspect of the present invention an automatic transmission power control circuit which automatically controls a transmission power of a radio communication system, the automatic transmission power control circuit comprising:

a detector which detects a voltage corresponding to the transmission power and outputs a detected voltage;

a comparator which compares the detected voltage with a reference voltage so that the transmission power is controlled based on an output of the comparator;

an up-down counter which cumulates the output of the comparator; and a transmission power abnormality detecting circuit which outputs a transmission power abnormality detection signal when an absolute value of an output of the up-down counter exceeds a predetermined value.

According to the above-mentioned invention, the up-down counter can be commonly used for the control loop circuit and the transmission power abnormality detecting circuit. This simplifies a structure of the automatic transmission power control circuit.

In the above-mentioned invention, a first clock signal may be provided to the up-down counter when a power is turned on and a second clock signal may be provided to the up-down counter instead of the first clock signal after the transmission power is substantially raised to a level to be controlled, the first clock signal having a frequency higher than the second clock signal.

Accordingly, the up-down counter used in the control loop circuit is provided with the first clock signal having a frequency higher than the second clock signal, the second clock signal being provided after a predetermined time has passed after the power is turned on. Thus, a loop gain of the automatic transmission power control circuit can be rapidly raised to a desired level, resulting a reduction in a time for stabilizing the transmission power.

Other objects, features and advantages of the present invention will become more apparent from the following detailed description when read in conjunction with the accompanying drawings.

DETAILED DESCRIPTION OF THE PREFERRED EMBEDMENTS

In FIG. 2, it is considered that the APC is not effectively functioning in the following conditions.

1) The detected voltage continuously increases beyond the upper limit as indicated by the later half of the solid line 17.

2) The detected voltage continuously decreases beyond the lower limit in reverse of the later half of the solid line 17.

3) The detected voltage never reaches a desired voltage as indicated by the dashed line 16.

In the above-mentioned conditions, the comparator 5 continuously outputs the high-level signal "H" in the conditions 1) and 3), and continuously outputs the low-level signal "L" in the condition 2). As a result, if an accumulator is provided on the output side of the comparator 5, a value of the accumulator is continuously increased in the conditions 1) and 3), or is continuously decreased in the condition 2). It should be noted that when the APC is functioning effectively, the high-level signal "H" and the low-level signal "L" are alternately or substantially alternatively output from the comparator 5. Accordingly, the detected voltage exhibits a completely different mode of change from a mode that is shown when the APC is functioning effectively.

In the above-mentioned conditions 1), 2) and 3), since the value of the accumulator of the comparator 5 is continuously increased or decreased, the value output from the accumulator may become an extremely large value which is not reached in a normal condition. In such conditions, the transmission power is also at an abnormal level as follows.

1) The level of the transmission power exceeds the upper limit level (over power).

2) The level of the transmission power is below the lower limit level (low power).

3) The level of the transmission power does not reach a desired level. The output may be distorted, and an abnormality of the transmission power should be detected.

Figure 3:
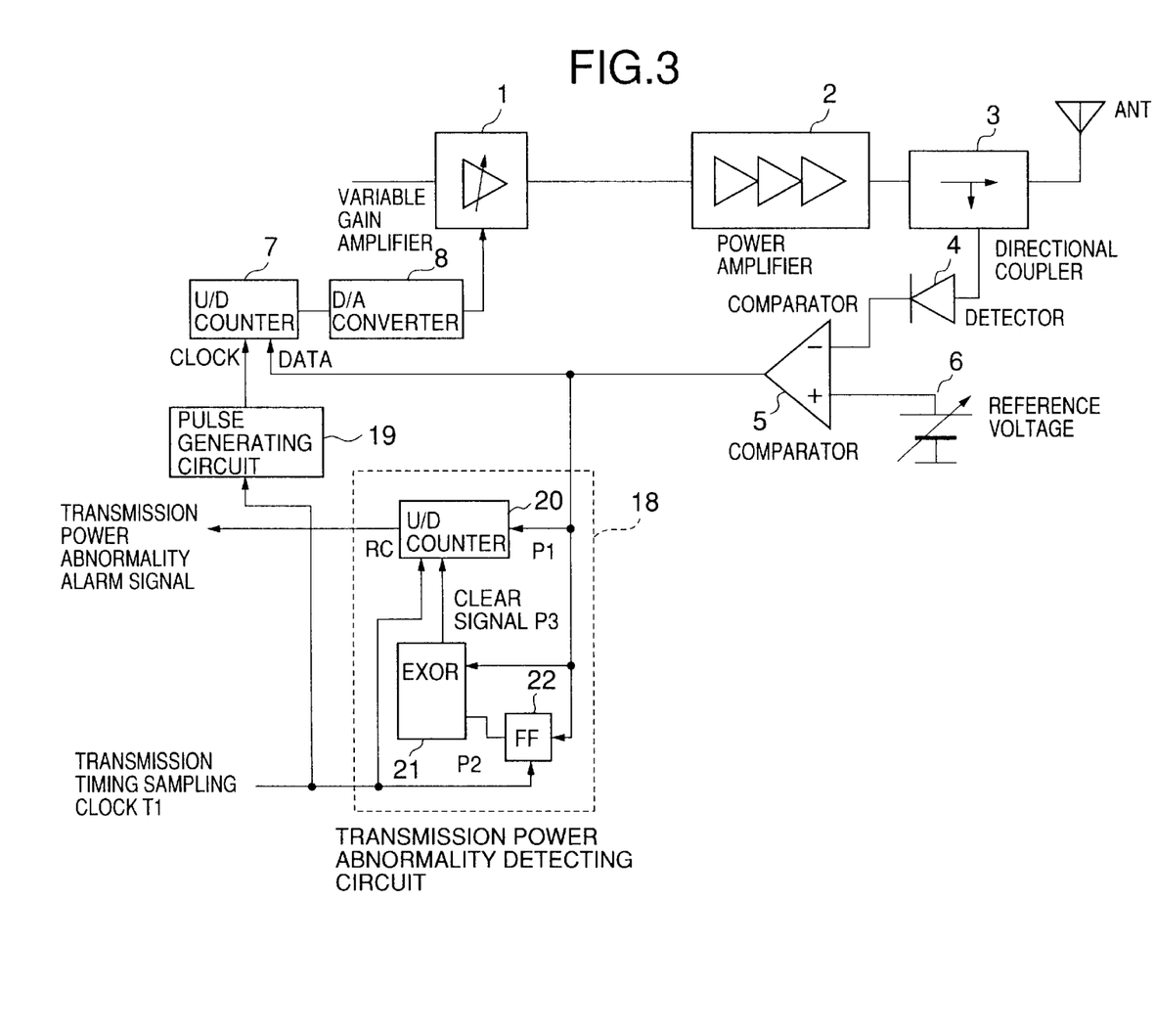
FIG. 3 is a circuit diagram of an automatic transmission power control circuit according to a first embodiment of the present invention.

A description will now be given, with reference to FIG. 3, of a first embodiment of the present invention. FIG. 3 is a circuit diagram of an automatic transmission power control circuit according to the first embodiment of the present invention. In FIG. 3, parts that are the same as the parts shown in FIG. 1 are given the same reference numerals. Hereinafter the automatic transmission power control circuit may be referred to as APC.

In the APC shown in FIG. 3, a modulated wave to be transmitted is transmitted from an antenna ANT via a variable gain amplifier 1, a power amplifier 2 and a directional coupler 3. A part of the transmission power is branched by the directional coupler 3, and is detected by a detector 4. An output of the detector 4 is compared with a reference voltage 6 by a comparator 5. When the output of the detector 4 is less than the reference voltage 6, a high-level signal "H" is output from the comparator 5. On the other hand, when the output of the detector 4 is greater than the reference voltage 6, a low-level signal "L" is output from the comparator 5.

The output of the comparator 5 is input to an up-down counter 7 at a timing determined by a clock signal supplied by a pulse generating circuit 19. When the output of the comparator 5 is the high-level signal "H", a count value of the up-down counter 7 is increased. When the output of the comparator 5 is the low-level signal "L", the count value of the up-down counter 7 is decreased. An output of the up-down counter 7 is converted into an analog signal by a D/A converter 8. The analog signal controls the variable gain amplifier 1.

In the first embodiment, a transmission power abnormality detecting circuit 18 is provided so as to cumulate the output of the comparator 5. The transmission power abnormality detecting circuit 18 includes an up-down counter 20 which is separate from the up-down counter 7, a flip-flop circuit (FF) 22 and an exclusive OR circuit (EXOR) 21. A transmission timing sampling clock signal T1 is provided to the up-down counter 20 and the flip-flop circuit 22. The flip-flop circuit 22 and the exclusive OR circuit 21 together serve to detect an inversion of the output of the comparator 5. An output P2 of the flip-flop circuit 22 is input to the exclusive OR circuit 21. The up-down counter 20 is reset by an output (clear signal P3) of the exclusive OR circuit 21.

In the first embodiment, the output of the comparator 5 is cumulated by the up-down counter 20 at a timing determined by the transmission timing sampling clock T1. Additionally, the output of the comparator 5 is supplied to the exclusive OR circuit 21 and the flip-flop circuit 22. The clear signal is output from the exclusive OR circuit 21 when the output P1 of the comparator is inverted. Accordingly, the up-down counter 20 is reset when the output P1 of the comparator 5 is inverted.

As mentioned above, when the APC is functioning normally, the output P1 of the comparator 5 is substantially alternately switched between the high-level signal "H" and the low-level signal "L", that is, the output P1 is frequently inverted. Thus, the count value of the up-down counter 20 is frequently reset by the clear signal P3, resulting in the count value being maintained at a small value close to zero.

In the present embodiment, the condition discussed with reference to FIG. 2 may occur such that:

1) the detected voltage continuously increases beyond the upper limit as indicated by the later half of the solid line 17;

2) the detected voltage continuously decreases beyond the lower limit in reverse of the later half of the solid line 17; or 3) the detected voltage never reaches a desired voltage as indicated by the dashed line 16.

In the above-mentioned conditions, the comparator 5 continuously outputs the high-level signal "H" in the conditions 1) and 3), and continuously outputs the low-level signal "L" in the condition 2). Accordingly, the output P1 is not inverted and thus the clear signal P3 is not outputted from the exclusive OR circuit 21. Thus, the count value of the up-down counter 20 is continuously increased. As a result, the count value of the up-down counter 20 becomes a large value as compared to the value (which is a small value close to zero) obtained when the automatic transmission power control circuit is functioning normally.

In the present embodiment, it can be determined that the automatic transmission power control circuit is in one of the above-mentioned conditions 1), 2) and 3) when the count value of the up-down counter 20, which is reset when the transmission power is at a desired level, exceeds a predetermined value. In this case, it can be determined that the automatic transmission power control circuit is not functioning normally, and, thus, a transmission power abnormality detection signal is output from the transmission power abnormality detecting circuit 18.

In the present embodiment, a ripple carry (RC) which is output when the count value of the up-down counter 20 reaches the maximum value ("11 . . . 11") is used as the transmission power abnormality detection signal. In this case, there is no need to provide the above-mentioned predetermined value used for determining abnormality of the automatic transmission power control circuit. This eliminates a circuit for setting the predetermined value, and a structure of the transmission power abnormality detecting circuit 18 can be simplified.

Figure 4:
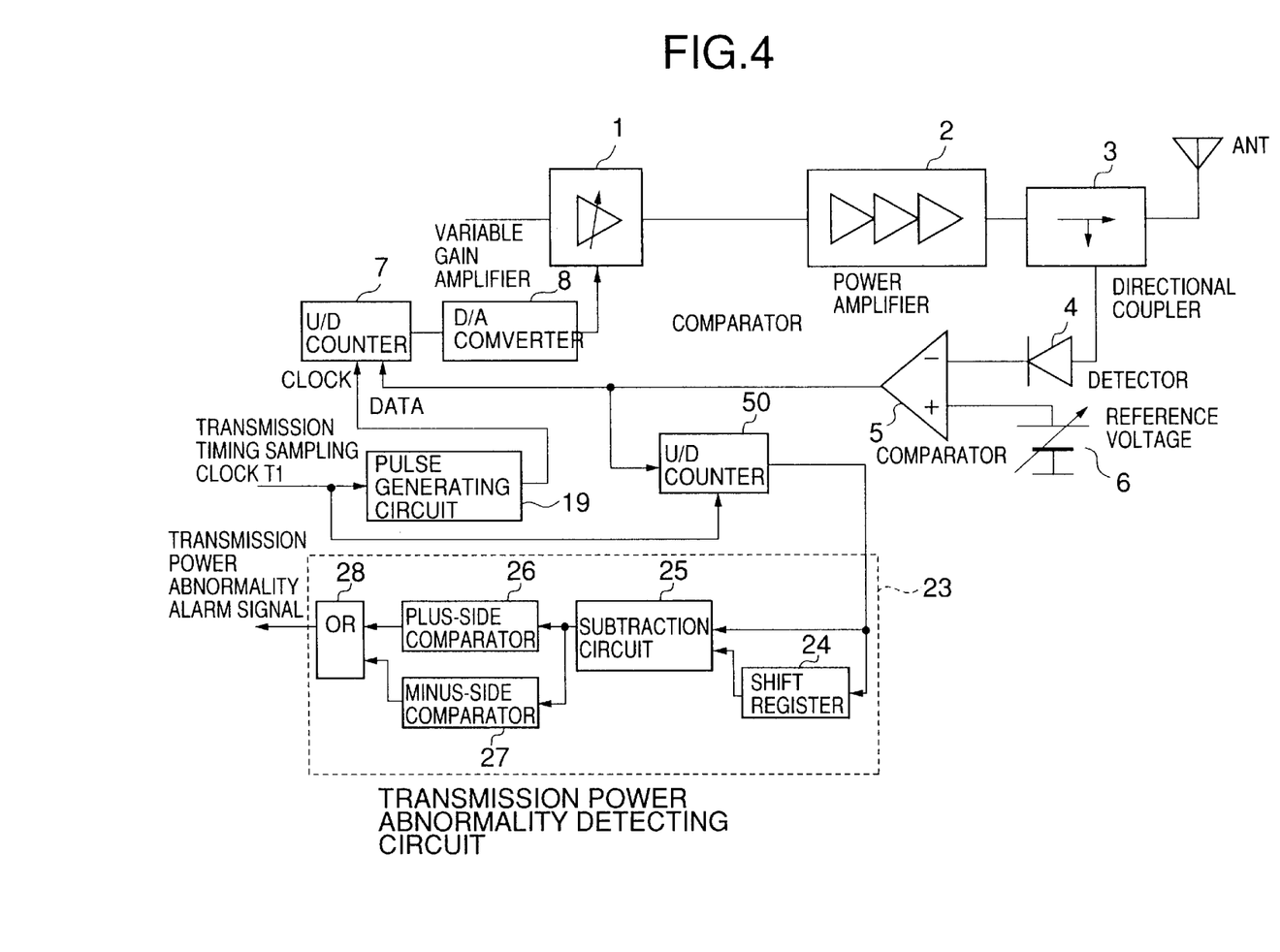
FIG. 4 is a circuit diagram of an automatic transmission power control circuit according to a second embodiment of the present invention.

A description will now be given, with reference to FIG. 4, of a second embodiment of the present invention. FIG. 4 is a circuit diagram of an automatic transmission power control circuit according to the second embodiment of the present invention. In FIG. 4, parts that are the same as the parts shown in FIG. 3 are given the same reference numerals, and descriptions thereof will be omitted.

The automatic transmission power control circuit shown in FIG. 4 includes an up-down counter 50 and a transmission power abnormality detecting circuit 23 instead of the transmission power abnormality detecting circuit 18 provided in the above-mentioned first embodiment. The transmission power abnormality detecting circuit 23 comprises a shift register 24, a subtraction circuit 25, a plus-side comparator 26, a minus-side comparator 27 and an OR circuit 28. The up-down counter 50 cumulates the output of the comparator 50 at a timing determined by the transmission timing sampling clock T1.

In the present embodiment, an output of the up-down counter 50 is input to the shift register 24 and the subtraction circuit 25. An output of the subtraction circuit 25 is input to the plus-side comparator 26 and the minus-side comparator 27 so as to determine whether or not an absolute value of the output of the subtraction circuit 25 exceeds a predetermined value. The transmission power abnormality detecting circuit 23 outputs the transmission power abnormality detection signal when the absolute value of the output of the subtraction circuit 25 exceeds a predetermined value.

Specifically, a predetermined number of samples (for example, 100 samples) in the count value of the up-down counter 50 is delayed by the shift register 24. An output of the shift register 24 is subtracted from the count value of the up-down counter 50. If the output of the subtraction circuit 25 is a plus value, the output is compared with a predetermined plus value by the plus-side comparator 26. If the output of the subtraction circuit 25 is a minus value, the output is compared with a predetermined minus value by the minus-side comparator 27. Accordingly, it is determined by the combination of the plus-side comparator 26 and the minus-side comparator 27 whether a difference between the current count value and the count value prior to the predetermined number of samples exceeds the predetermined value. When the output of the subtraction circuit 25 is a plus value and is greater than the predetermined plus value, a high-level signal "H" is output from the plus-side comparator 26. On the other hand, when the output of the subtraction circuit 25 is a minus value, and is smaller than the predetermined minus value, the high-level signal "H" is output from the minus-side comparator 27. Each of the high-level signals is output from the transmission power abnormality detecting circuit 23 via the OR circuit 28 as the transmission power abnormality detection signal.

When the APC is effectively functioning, the high-level signal "H" and the low-level signal "L" are output alternately or substantially alternately. Accordingly, the count value of the up-down counter 50 does not fluctuate much when the APC is functioning normally, that is, when the transmission power is in a stable condition.

However, if the APC is not functioning normally, the condition discussed with reference to FIG. 2 may occur such that:

1) the detected voltage continuously increases beyond the upper limit as indicated by the later half of the solid line 17;

2) the detected voltage continuously decreases beyond the lower limit in reverse of the later half of the solid line 17; or 3) the detected voltage never reaches a desired voltage as indicated by the dashed line 16.

The comparator 5 continuously outputs the high-level signal "H" in the conditions 1) and 3), and continuously outputs the low-level signal "L" in the condition 2). Accordingly, the output of the up-down counter 50 is continuously increased or decreased. In such a case, a difference between the present count value and the count value obtained a predetermine time before (prior to a predetermined number of samples) exceeds the predetermined value. Thus, in the present embodiment, a determination is made that the automatic transmission power control circuit is not functioning normally when the above-mentioned difference exceeds the predetermined value, and the transmission power abnormality detection signal is output.

Figure 5:
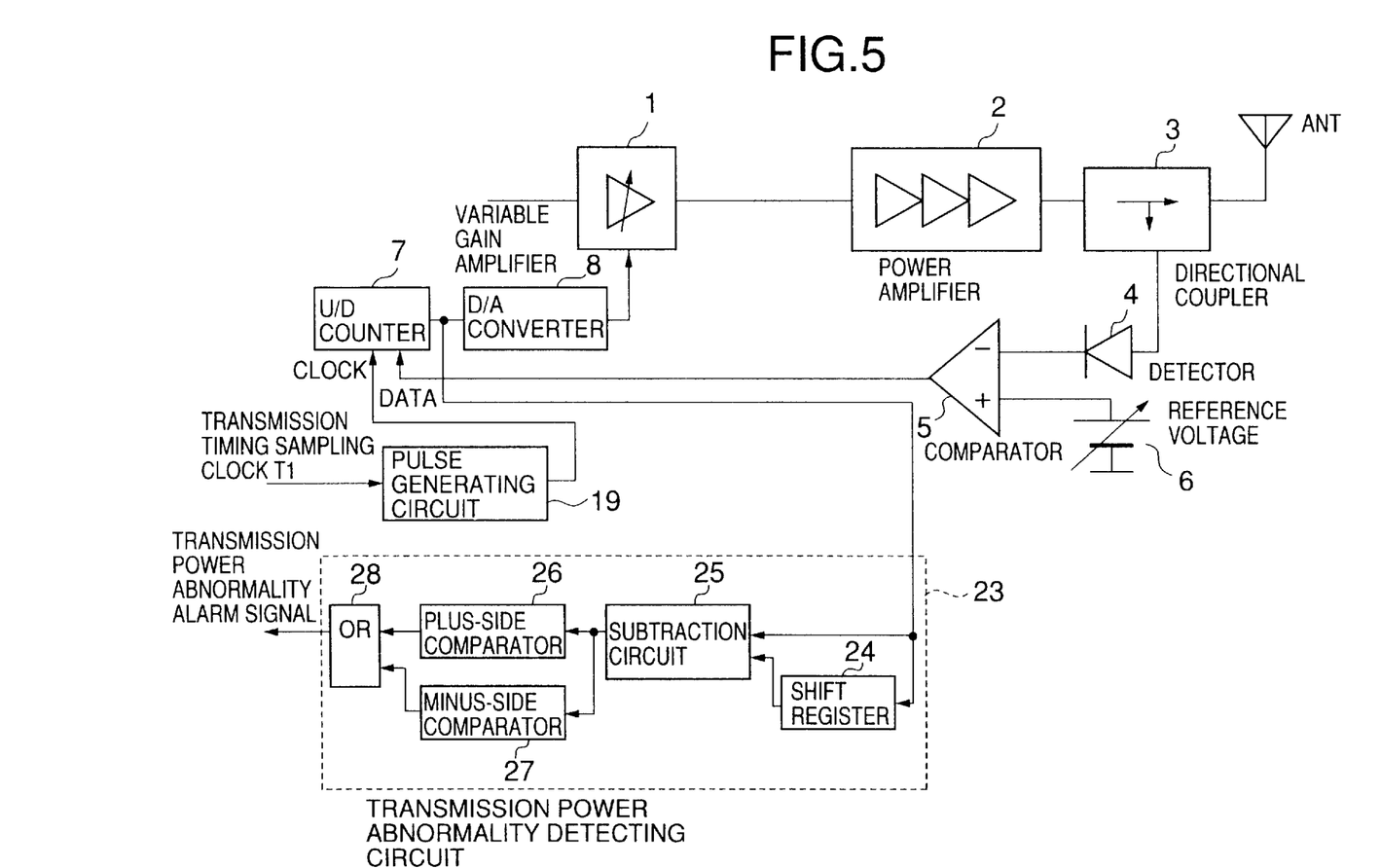
FIG. 5 is a circuit diagram of a variation of the automatic transmission power control circuit according to the second embodiment of the present invention.

FIG. 5 is a circuit diagram of a variation of the automatic transmission power control circuit according to the second embodiment of the present invention. In FIG. 5, parts that are the same as the parts shown in FIG. 4 are given the same reference numerals, and descriptions thereof will be omitted.

The automatic transmission power control circuit shown in FIG. 5 has the same structure as that of the automatic transmission power control circuit according to the second embodiment shown in FIG. 4 except for the up-down counter 7 being used for providing the count value of the output of the comparator 5 to the transmission power abnormality detecting circuit 23. That is, the up-down counter 7 also serves a function of the up-down counter 50. This provides a simple structure to the transmission power abnormality detecting circuit 23.

Figure 6:
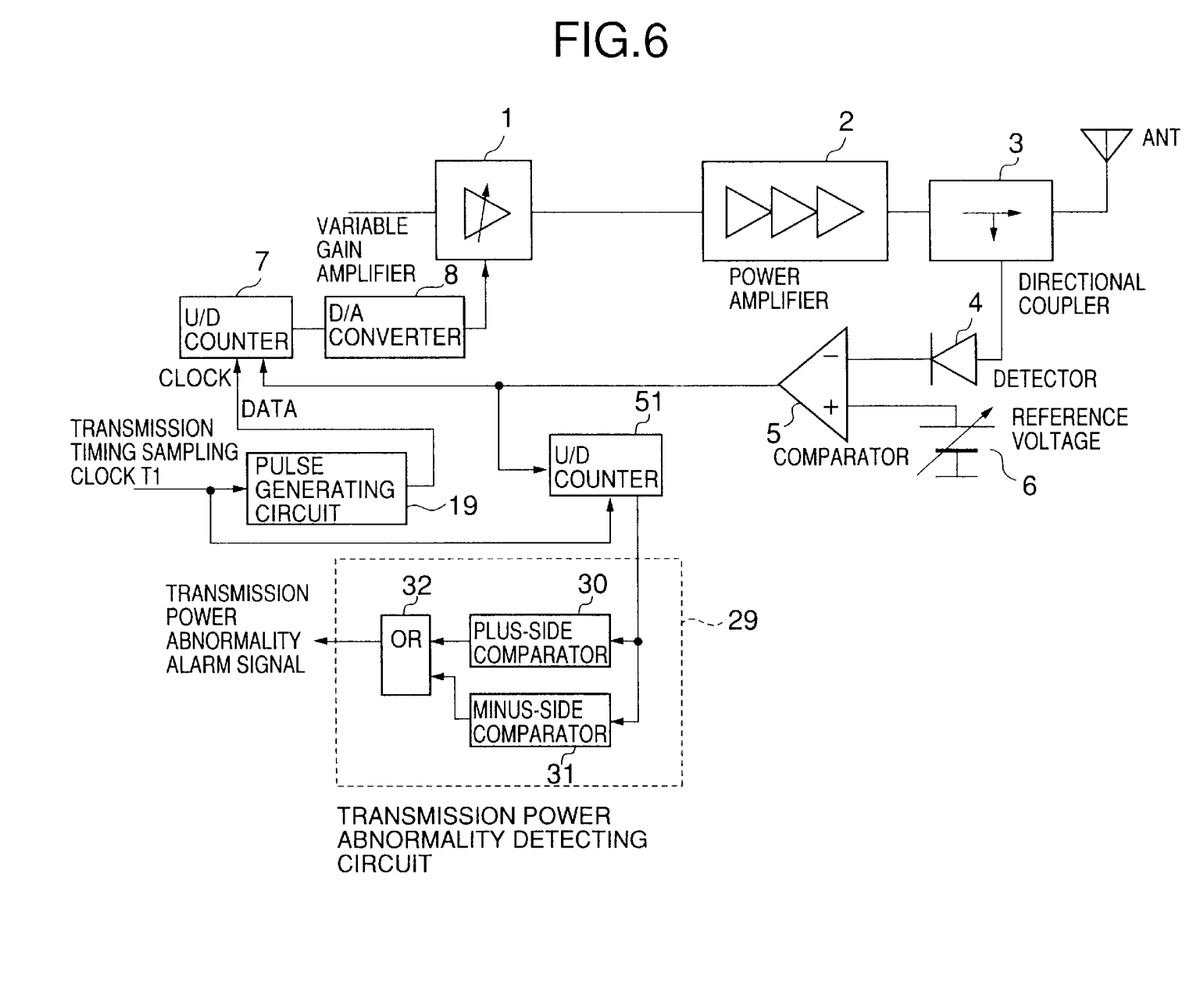
FIG. 6 is a circuit diagram of an automatic transmission power control circuit according to a third embodiment of the present invention.

A description will now be given, with reference to FIG. 6, of a third embodiment of the present invention. FIG. 6 is a circuit diagram of an automatic transmission power control circuit according to the third embodiment of the present invention. In FIG. 6, parts that are the same as the parts shown in FIG. 3 are given the same reference numerals, and descriptions thereof will be omitted.

The automatic transmission power control circuit shown in FIG. 6 includes an up-down counter 51 and a transmission power abnormality detecting circuit 29 instead of the transmission power abnormality detecting circuit 18 provided in the above-mentioned first embodiment. The transmission power abnormality detecting circuit 29 comprises a plus-side comparator 30, a minus-side comparator 31 and an OR circuit 32. The up-down counter 51 cumulates the output of the comparator 5 at a timing determined by the transmission timing sampling clock T1.

In the present embodiment, an output of the up-down counter 51 is input to the plus-side comparator 30 and the minus-side comparator 31 so as to determine whether or not an absolute value of the output of the up-down counter 51 exceeds a predetermined value. That is, if the output of the up-down counter 51 is a plus value, the output is compared with a predetermined plus value by the plus-side comparator 30. If the output of the up-down counter 31 is a minus value, the output is compared with a predetermined minus value by the minus-side comparator 31. Accordingly, it is determined by the combination of the plus-side comparator 30 and the minus-side comparator 31 whether the absolute value of the count value of the up-down counter 51 exceeds the predetermined value. When the output of the up-down counter 51 is a plus value and is greater than the predetermined plus value, a high-level signal "H" is output from the plus-side comparator 30. On the other hand when the output of the up-down counter 51 is a minus value, and is smaller than the predetermined minus value, the high-level signal "H" is output from the minus-side comparator 31. Each of the high-level signals is output from the transmission power abnormality detecting circuit 23 via the OR circuit 32 as the transmission power abnormality detection signal.

When the APC is functioning effectively and when the transmission power is stabilized, the high-level signal "H" and the low-level signal "L" are output alternatively or substantially alternately. Accordingly, the count value of the up-down counter 51 does not fluctuate much when the APC is functioning normally and the transmission power is in a stable condition.

However, if the APC is not functioning normally, the condition discussed with reference to FIG. 2 may occur such that:

1) the detected voltage continuously increases beyond the upper limit as indicated by the later half of the solid line 17;

2) the detected voltage continuously decreases beyond the lower limit in reverse of the later half of the solid line 17; or 3) the detected voltage never reaches a desired voltage as indicated by the dashed line 16.

The comparator 5 continuously outputs the high-level signal "H" in the conditions 1) and 3), and continuously outputs the low-level signal "L" in the condition 2). Accordingly, the absolute value of the output of the up-down counter 51 becomes a large value either in the plus side or the minus side. In such a case, the absolute value of the up-down counter 51 exceeds the predetermined value. Thus, in the present embodiment, the high-level signal "H" output from either the plus-side comparator 30 or the minus-side comparator 31 is output as the transmission power abnormality detection signal from the transmission power abnormality detecting circuit 29 via the OR circuit 32.

Figure 7:
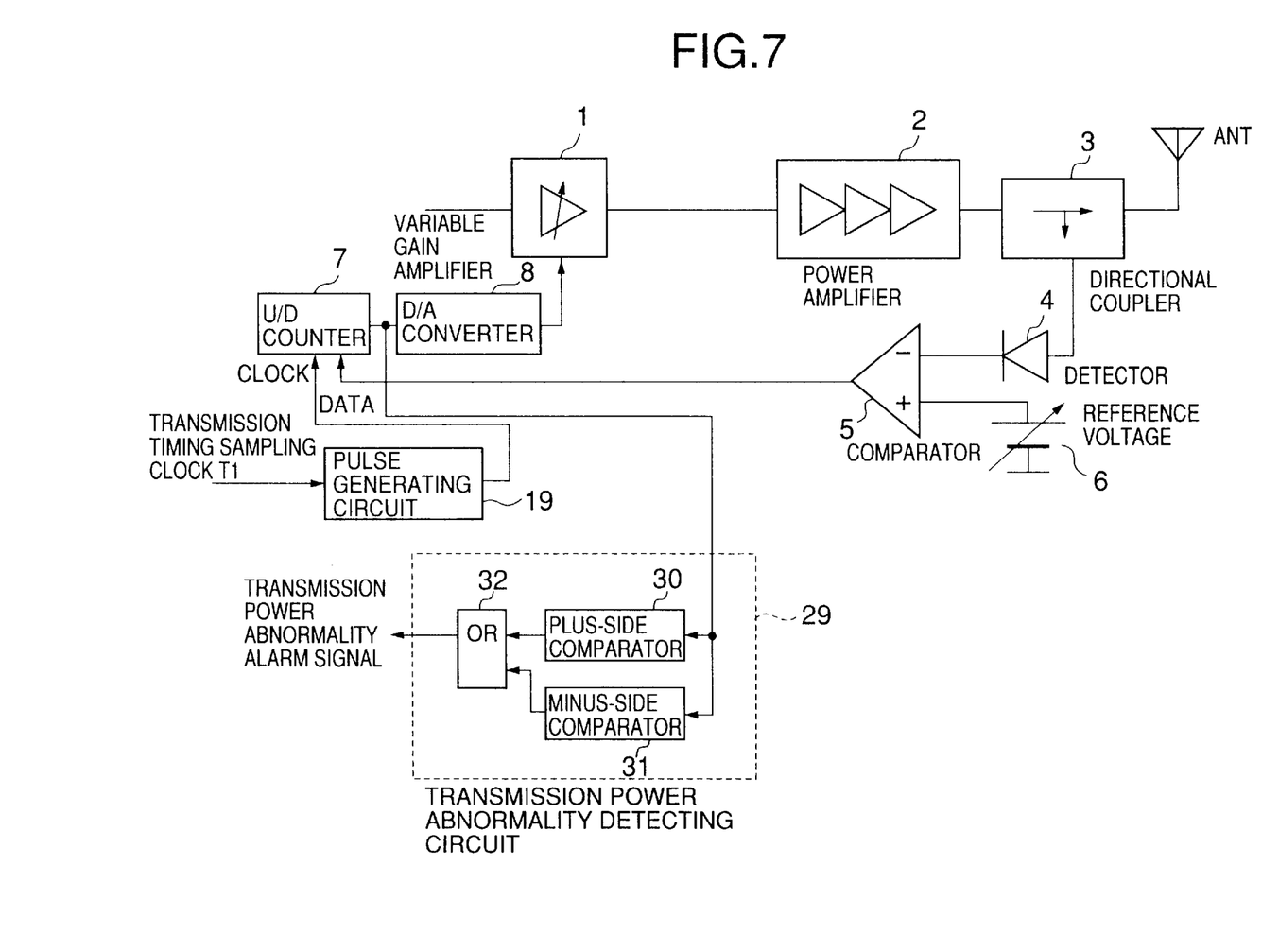
FIG. 7 is a circuit diagram of a variation of the automatic transmission power control circuit according to the third embodiment of the present invention.

FIG. 7 is a circuit diagram of a variation of the automatic transmission power control circuit according to the third embodiment of the present invention. In FIG. 7, parts that are the same as the parts shown in FIG. 6 are given the same reference numerals, and descriptions thereof will be omitted.

The automatic transmission power control circuit shown in FIG. 7 has the same structure as that of the automatic transmission power control circuit according to the third embodiment shown in FIG. 6 except for the up-down counter 7 being used for providing the count value of the output of the comparator 5 to the transmission power abnormality detecting circuit 29. That is, the up-down counter 7 also serves a function of the up-down counter 51. This provides a simple structure to the transmission power abnormality detecting circuit 29.

Figure 8:
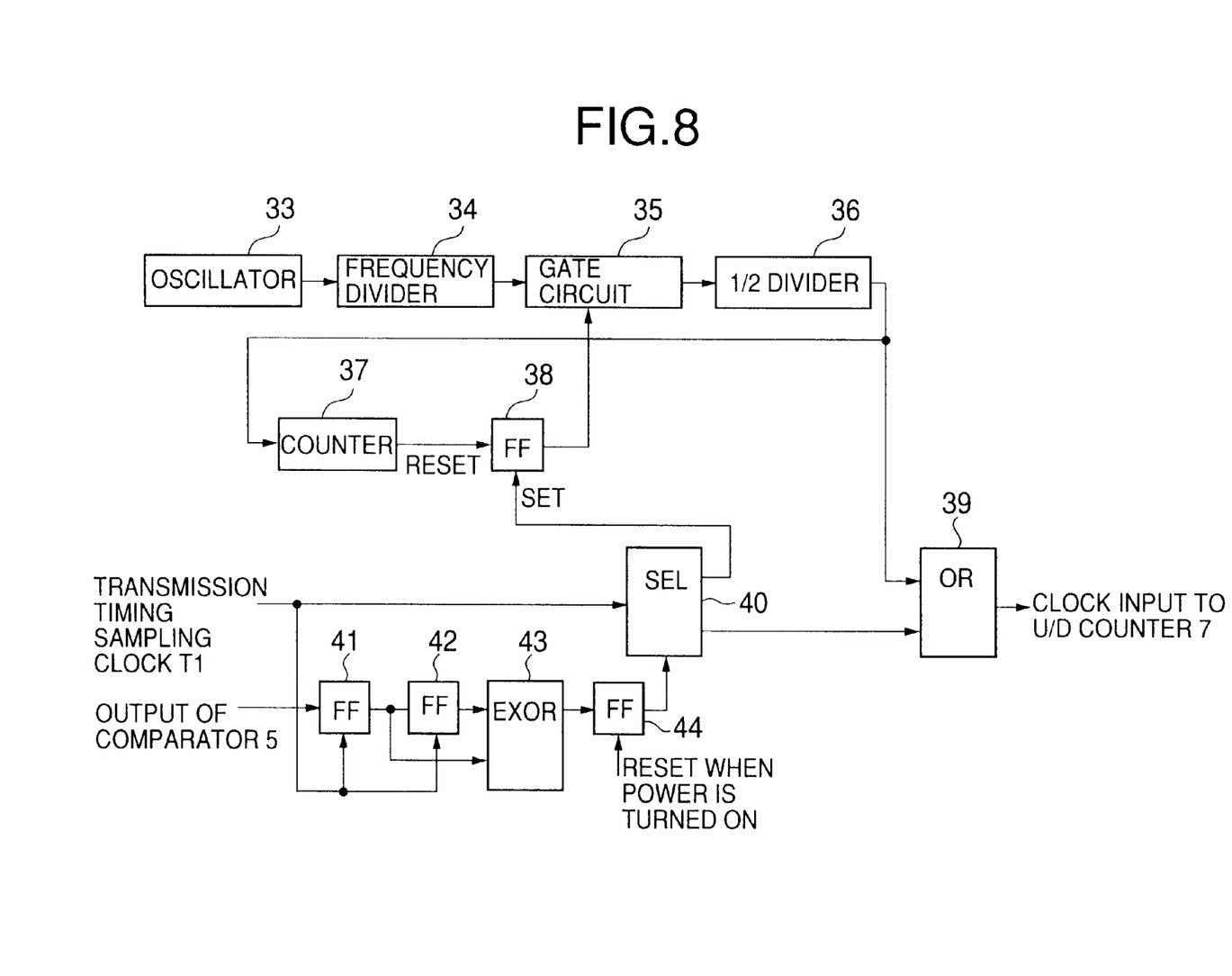
FIG. 8 is a block diagram of a pulse generating circuit shown in FIGS. 3 to 7.

FIG. 8 is a block diagram of the pulse generating circuit 19 shown in FIGS. 3 to 7.

In the pulse generating circuit 19, an output of an oscillator 33 is supplied to an OR circuit 39 via a frequency divider 34, a gate circuit 35 and a ½ divider 36, and the output of the OR circuit 39 is supplied to the up-down counter 7 as a clock signal. The gate circuit 35 opens and closes in response to an output of a flip-flop circuit 38. Specifically, the gate circuit 35 is open when the output of the flip-flop circuit 38 is at a high-level "H", and is closed when the output of the flip-flop circuit 38 is at a low-level "L". The flip-flop circuit 38 is set by an output of a selector 40, and is reset by an output of a counter 37 which serves as a divider.

Figure 9:
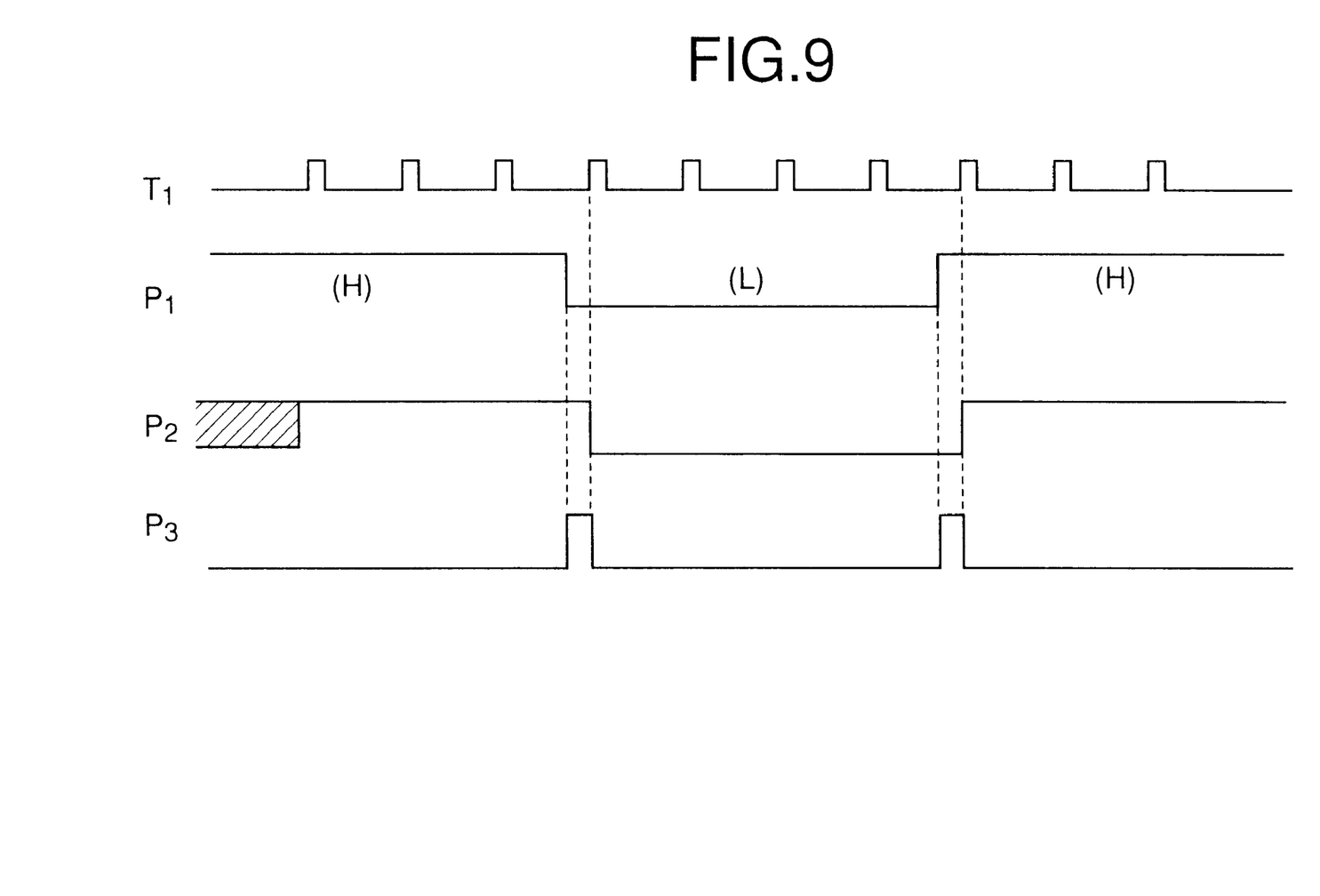
FIG. 9 is a timing chart for explaining an inversion of an output of a comparator shown in FIG. 3.

The selector 40 selects the flip-flop circuit 38, which is reset, in response to an output of a flip-flop circuit 44 when a power is turned on. The selector 40 selects the OR circuit 39 when the flip-flop circuit 44 is set. The output of the comparator 5 is input to a flip-flop circuit 41 in synchronization with the transmission timing sampling clock T1. An output of the flip-flop circuit 41 is input to a flip-flop circuit 42 and an exclusive OR circuit 43. The transmission timing sampling clock T1 is also input to the flip-flop circuit 42 so that the output of the flip-flop circuit 41 is delayed by a single clock cycle of the transmission timing sampling signal T1. The output of the flip-flop circuit 42 is input to the exclusive OR circuit 43. The flip-flop circuit 42 and the exclusive OR circuit 43 cooperate to detect an inversion of the output P1 of the comparator 5 (refer to FIG. 9). When the output P1 is inverted, the flip-flop circuit 44 is set so that the selector 40 selects the OR circuit 39. The flip-flop circuit 44 outputs a low-level signal "L" when the power is turned on, and is set by a high-level signal "H" output from the exclusive OR circuit 43 so as to switch the selector 40.

When the power is turned on, the selector 40 selects the flip-flop circuit 38 since the output of the flip-flop circuit 44 is at the low level "L". Accordingly, the transmission timing sampling clock T1 is provided to the flip-flop circuit 38. Thereby, the flip-flop circuit 38 is set and the gate 35 is opened so that an output of the frequency divider 34 is provided to the ½ divider 36 via the gate circuit 35. The output of the ½ divider 36 is input to the OR circuit 39 and the counter 37. The counter 37 resets the flip-flop circuit 38 when a predetermined number (n) of pulses are counted so as to close the gate circuit 35. Accordingly, the gate circuit 35 outputs the output of the frequency divider 34 to the OR circuit via the ½ divider 36 for each pulse of the transmission timing sampling clock T1 while the gate circuit 35 is open. The number (n) of the pulses per one clock cycle of the transmission timing sampling clock T1 is determined by the setting of the counter 37.

When the power is turned on, the output of the ½ divider 36 is provided to the up-down counter 7 via the OR circuit 39. However, when the output P1 of the comparator 5 is inverted, the transmission timing sampling signal itself is provided as a clock signal to the up-down counter 7 via the OR circuit 39. The output of the ½ divider 36 has a higher frequency than the transmission timing sampling clock T1 by n times which is set by the counter 37.

Accordingly, the clock frequency input to the up-down counter 7 is higher (n times) than the regular clock frequency, and is switched to the transmission timing sampling clock T1 which is the regular clock frequency after the output P1 of the comparator 5 is inverted, that is, when the transmission power becomes a desired level. Thus, the clock frequency input to the up-down counter 7 is increased when a power is turned on, which results in a reduction of time needed for stabilizing the transmission power level. This prevents an erroneous detection of an abnormality being made when a power is turned on.

It should be noted that since an alarm for an abnormality is based on a detection of the abnormality, the above-mentioned transmission power abnormality detection signal itself can be used as a transmission power abnormality alarming signal.

The present invention is not limited to the specifically disclosed embodiments, and variations and modifications may be made without departing from the scope of the present invention.

What is claimed is:

1. An automatic transmission power control circuit which automatically controls a transmission power of a radio communication system, said automatic transmission power control circuit comprising:

a detector which detects a voltage corresponding to the transmission power and outputs a detected voltage;

a comparator which compares the detected voltage with a reference voltage so that the transmission power is controlled based on an output of said comparator; and a transmission power abnormality detecting circuit including a counter which cumulates the output of said comparator, said transmission power abnormality detecting circuit outputting a transmission power abnormality detection signal when an output of said counter is a value which is out of a normal range when said automatic power transmission control circuit is functioning normally.

2. The automatic transmission power control circuit as claimed in claim 1, wherein said counter is reset when the output of said comparator is inverted so that the transmission power abnormality detection signal is output from said transmission power abnormality detecting circuit when the output of said counter exceeds a predetermined value.

3. The automatic transmission power control circuit as claimed in claim 2, wherein said counter is an up-down counter, and the transmission power abnormality detection signal output from said transmission power abnormality detecting circuit comprises a ripple carry output from said up-down counter.

4. The automatic transmission power control circuit as claimed in claim 1, wherein said transmission power abnormality detecting circuit obtains a difference between a current value of the output of said counter and a previous value of the output of said counter, the previous value being output a predetermined time prior to the current value, so as to output the transmission power abnormality detection signal when an absolute value of the difference exceeds a predetermined value.

5. The automatic transmission power control circuit as claimed in claim 1, wherein said transmission power abnormality detecting circuit outputs the transmission power abnormality detection signal when an absolute value of the output of said counter exceeds a predetermined value.

6. The automatic transmission power control circuit as claimed in claim 1, further comprising a second counter included in a control loop circuit outputting the controlled transmission power so as to cumulate the output of said comparator, wherein a first clock signal is provided to said second counter when a power is turned on and a second clock signal is provided to said second counter instead of said first clock signal after the transmission power is substantially raised to a level to be controlled, said first clock signal having a frequency higher than said second clock signal.

7. An automatic transmission power control circuit which automatically controls a transmission power of a radio communication system, said automatic transmission power control circuit comprising:

a detector which detects a voltage corresponding to the transmission power and outputs a detected voltage;

a comparator which compares the detected voltage with a reference voltage so that the transmission power is controlled based on an output of said comparator;

an up-down counter which cumulates the output of said comparator; and a transmission power abnormality detecting circuit which obtains a difference between a current value of an output of said up-down counter and a previous value of the output of said up-down counter, the previous value being obtained a predetermined time prior to the current value, so as to output a transmission power abnormality detection signal when an absolute value of the difference exceeds a predetermined value.

8. The automatic transmission power control circuit as claimed in claim 7, wherein a first clock signal is provided to said up-down counter when a power is turned on and a second clock signal is provided to said up-down counter instead of said first clock signal after the transmission power is substantially raised to a level to be controlled, said first clock signal having a frequency higher than said second clock signal.

9. An automatic transmission power control circuit which automatically controls a transmission power of a radio communication system, said automatic transmission power control circuit comprising:

a detector which detects a voltage corresponding to the transmission power and outputs a detected voltage;

a comparator which compares the detected voltage with a reference voltage so that the transmission power is controlled based on an output of said comparator;

an up-down counter which cumulates the output of said comparator; and a transmission power abnormality detecting circuit which outputs a transmission power abnormality detection signal when an absolute value of an output of said up-down counter exceeds a predetermined value.

10. The automatic transmission power control circuit as claimed in claim 9, wherein a first clock signal is provided to said up-down counter when a power is turned on and a second clock signal is provided to said up-down counter instead of said first clock signal after the transmission power is substantially raised to a level to be controlled, said first clock signal having a frequency higher than said second clock signal.

* * * * *